(12) United States Patent
Pankratz et al.

(10) Patent No.: US 10,193,545 B1
(45) Date of Patent: Jan. 29, 2019

(54) POWER-ON RESET SYSTEM FOR SECONDARY SUPPLY DOMAIN

(71) Applicant: SILICON LABORATORIES INC., Austin, TX (US)

(72) Inventors: Erik Pankratz, Austin, TX (US); Arnab Dutta, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/687,781

(22) Filed: Aug. 28, 2017

(51) Int. Cl.
*H03L 7/00* (2006.01)
*H03K 17/22* (2006.01)
*H03K 19/0185* (2006.01)
*H03K 5/24* (2006.01)

(52) U.S. Cl.
CPC ......... *H03K 17/223* (2013.01); *H03K 5/2472* (2013.01); *H03K 19/018521* (2013.01)

(58) Field of Classification Search
CPC .................................................. H03K 17/223
See application file for complete search history.

(56) References Cited

U.S. PATENT DOCUMENTS 9,698,770 B1 * 7/2017 Menezes .................. H03K 5/04

* cited by examiner

*Primary Examiner* — Daniel Puentes
(74) *Attorney, Agent, or Firm* — Gary Stanford (57) ABSTRACT

A POR circuit for a secondary supply domain of an IC. A bias and reference circuit provides startup current and a reference voltage for a comparator. The comparator compares the reference voltage with a primary supply voltage and develops a bias current. The bias and reference circuit and the comparator includes a VGS loop which mirrors the bias current to develop the reference voltage. When the comparator switches, the bias current is at the low quiescent current level. A level shift and isolation circuit initially isolates a primary POR signal from the secondary domain. When the comparator switches, the primary POR signal is detected and level shifted to control the reset state. The delay circuit senses ramping of the secondary supply voltage and provides a delayed secondary POR signal a predetermined time period after the secondary supply voltage achieves a predetermined voltage threshold to additionally control the reset state.

20 Claims, 6 Drawing Sheets

POWER-ON RESET SYSTEM FOR SECONDARY SUPPLY DOMAIN

BACKGROUND OF THE INVENTION

Field of the Invention

The present invention relates in general to power-on reset (POR), and more particularly, to a POR system for a secondary supply domain including self-biasing reference voltage generation along with primary POR signal isolation, qualification, and level shift across multiple power supply domains.

Description of the Related Art

Power-on reset (POR) circuitry autonomously generates a reference voltage for an integrated circuit (IC) or semiconductor chip, and holds the remainder of the IC in reset until a supply voltage exceeds the generated reference. The POR circuit remains active, since otherwise the chip potentially enters a latched reset state and may be unable to leave that state. The POR circuitry operates at a low quiescent current level to allow for low system energy consumption. Such low-current regimes typically entail substantial area due to the required device aspect ratios and large resistor values. POR operation is also complicated by integrated circuits with multiple supply domains. In particular, unless strict power domain constraints are imposed, POR functionality is replicated in multiple domains in which no one domain can be reliably designated to hold the others in reset in all possible supply states. This situation multiplies the area and power burden of the POR circuitry. Supply domain sequencing particularly comes into play when the input/output (I/O) supply is powered before the main analog and/or logic supply domain, since randomly initialized general purpose I/O (GPIO) circuits can provide spurious data to other devices in the system if powered before the primary supply domain.

Level shifting POR signals across multiple supply domains also proves problematic, as traditional level shifter topologies either consume static current or rely on systematic leakage or parasitic capacitor imbalance to define an initial state. Such dynamic or parasitic-based schemes often raise concerns of robustness, especially in the case of non-monotonic supply ramps. Also, the supply for the input POR signal has to be compared against a reference voltage to ensure the input POR signal is reliable. Performing such a supply comparison at low quiescent current essentially amounts to an auxilliary POR module.

SUMMARY OF THE INVENTION

A power-on reset (POR) circuit for a secondary supply domain of an integrated circuit (IC) according to at least one embodiment of the present invention includes a comparator, a bias and reference circuit, a level shift and isolation circuit, a delay circuit, and a control gate. The IC includes a primary supply domain receiving a primary supply voltage and the secondary supply domain receives a secondary supply voltage. The comparator compares a reference voltage with the primary supply voltage and establishes a bias current. The bias current is at a low quiescent level when the primary supply voltage is within a predetermined voltage offset of the reference voltage. The bias and reference circuit provides a startup current to the comparator, forms a VGS loop with the comparator, and mirrors the bias current through the VGS loop to provide the reference voltage. The level shift and isolation circuit is pre-biased upon startup to isolate a primary POR signal from the secondary supply domain while the bias current is above the low quiescent level. When the bias current falls to the low quiescent level, the isolation circuit transitions to a transparent state to receive the primary POR signal as a level shifted primary POR signal when the primary POR signal indicates that the primary supply domain is out of reset. The delay circuit is supplied by the secondary supply voltage and provides a delayed secondary POR signal a predetermined time period after the secondary supply voltage achieves a predetermined voltage threshold. The control gate determines a reset state of the secondary power domain based on the level shifted primary POR signal and the delayed secondary POR signal.

The bias and reference circuit and the comparator may include low threshold voltage devices, such as low threshold voltage MOS transistors or the like, to provide the startup current and for low headroom buffering. As the comparator begins operating and developing the bias current, the voltage in the VGS loop increases to shut off the startup current.

The level shift and isolation circuit may include a mirrored configuration sensing the bias current to isolate the primary POR signal from the secondary supply domain while the bias current is above the low quiescent level. When the bias current falls to the low quiescent level, the primary POR signal may be detected and level shifted into the secondary supply domain. The level shift and isolation circuit may be configured according to alternative embodiments including an isolation and latch circuit. The comparator may include a comparator output node indicative of the state of the comparator which holds the latch circuit in reset state until the comparator switches. When the comparator switches, the primary POR signal is used to control the state of the level shifted primary POR signal.

The delay circuit provides an additional reset protection when the comparator may have an indefinite state, such as when the primary and secondary supply voltages ramp up at about the same time. When the secondary supply voltage reaches a first voltage threshold, a current device, such as a PMOS transistor or the like, is turned on to charge a capacitor. When the capacitor voltage reaches a second voltage threshold, the delayed secondary POR signal is asserted to allow the secondary supply domain to be pulled out of the reset state.

An integrated circuit according to one embodiment includes a primary supply domain receiving a primary supply voltage and including a primary power-on reset (POR) circuit providing a primary POR signal, and a secondary supply domain receiving a secondary supply voltage and including a secondary POR circuit providing a secondary POR signal. The secondary POR circuit includes a comparator, a bias and reference circuit, a level shift and isolation circuit, a delay circuit and a control gate. The comparator is initiated by a startup current and develops a bias current while comparing a reference voltage with the primary supply voltage. The bias current is at a low quiescent level when the primary supply voltage is within an offset voltage of the reference voltage. The bias and reference circuit provides the startup current to the comparator, forms a VGS loop with the comparator, and mirrors the bias current through the VGS loop to provide the reference voltage. The level shift and isolation circuit isolates the primary POR signal and holds the secondary supply domain in a reset state while the bias current is above the low quiescent level. The level shift and isolation circuit converts the primary POR signal to a level shifted primary POR signal when the bias current falls to the low quiescent level. The delay circuit provides a delayed secondary POR signal a predetermined time period after the secondary supply voltage achieves a predetermined voltage threshold. The control gate determines the reset state of the secondary power domain based on the level shifted primary POR signal and the delayed secondary POR signal.

A method of releasing a secondary supply domain of an integrated circuit from a reset state according to one embodiment includes providing startup current to a comparator as a secondary supply voltage begins to rise, comparing, by the comparator, a reference voltage with the primary supply voltage and developing a bias current, and switching the comparator so that the bias current is at a low quiescent level when the primary supply voltage rises to within a predetermined voltage offset of the reference voltage, mirroring the bias current through a VGS loop to establish the reference voltage and turning off the startup current, isolating the primary POR signal from the secondary supply domain and holding the secondary supply domain in the reset state while the bias current is above the low quiescent level, detecting the primary POR signal when the bias current falls to the low quiescent level, providing a delayed secondary POR signal a predetermined time period after the secondary supply voltage achieves a predetermined voltage threshold, and releasing the secondary power domain from the reset state when the comparator, the primary POR signal and the delayed secondary POR signal indicate release from the reset state. The method may include level shifting the primary POR signal to provide a level shifted POR signal in the secondary supply domain, and releasing the secondary power domain from the reset state when the comparator, the level shifted primary POR signal and the delayed secondary POR signal indicate release from the reset state.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the challenges of providing a POR circuit for a (or each) secondary supply domain of an IC having a primary supply domain and one or more secondary supply domains. They have therefore developed a POR circuit for the secondary supply domain including a bias and reference circuit, a comparator, an isolation circuit, a delay circuit, and a control gate. The bias and reference circuit provides self-bias startup current and low headroom buffering. The bias and reference circuit may include low threshold voltage devices that provide startup current to the comparator and to provide a reference voltage for the comparator as soon as the secondary supply voltage supplying the secondary power domain begins to rise. The comparator compares the reference voltage with the primary supply voltage of the primary supply domain and develops a bias current. The bias and reference circuit forms a VGS loop with the comparator and mirrors the bias current into the VGS loop to develop the reference voltage. The initial startup current source is cut off when the bias current is established. The bias current may reach a relatively high current level when the secondary supply voltage ramps before the primary supply voltage. The initial higher power consumption is negligible, however, since the comparator reduces the bias current to a low quiescent current level when the primary supply voltage reaches a predetermined threshold. When the comparator switches, the bias current is reduced to the low quiescent current level and power consumption is minimized.

The isolation circuit is pre-biased into an isolation state while the bias current is above the low quiescent current level to initially isolate the primary POR signal provided by the primary supply domain from prematurely activating the secondary supply domain. When the comparator switches indicating that the primary supply voltage has reached the predetermined threshold, the isolation circuit transitions to a transparent state and is able to detect and latch the primary POR signal from the primary supply domain. The isolation circuit also performs level shifting between the primary and secondary supply domains, which is particularly advantageous when the supply voltages have different operating voltage levels. The delay circuit senses ramping of the secondary supply voltage and provides a delayed secondary POR signal (e.g., late signal) a predetermined time period after the secondary supply voltage achieves a predetermined voltage threshold. The delay circuit is advantageous when the primary and secondary supply voltages ramp at the same time such that the comparator output may be indeterminate. The control gate releases the secondary supply domain from reset only when the comparator output, the isolation circuit output, and the delay circuit assert corresponding POR signals.

Figure 1:
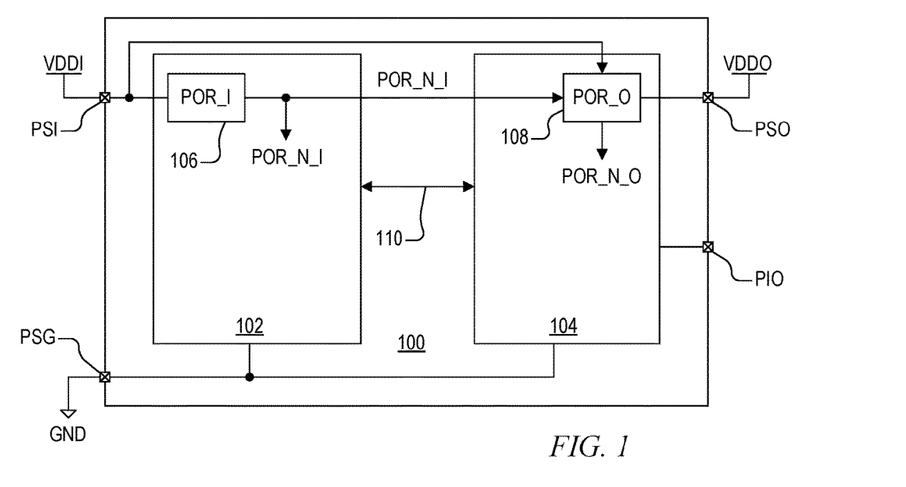
FIG. 1 is a simplified block diagram of a semiconductor chip or integrated circuit (IC) incorporating a power-on reset (POR) circuit implemented according to one embodiment of the present invention.

FIG. 1 is a simplified block diagram of a semiconductor chip or integrated circuit (IC) 100 incorporating a power-on reset (POR) circuit 108 implemented according to one embodiment of the present invention. The IC 100 includes a primary supply domain 102 and a secondary supply domain 104. Although only two supply domains are shown, the IC 100 represents any IC with multiple supply domains including a primary supply domain (e.g., the primary supply domain 102) and one or more secondary supply domains including the secondary supply domain 104 and any other secondary supply domains (not shown). The IC 100 includes a first power supply pin PSI receiving a primary supply voltage VDDI for supplying voltage the primary supply domain 102, and includes a second power supply pin PSO receiving a secondary supply voltage VDDO for supplying voltage to the secondary supply domain 104. VDDI and VDDO have supply voltage levels relative to a common or ground (GND) voltage level coupled via a ground pin PSG, which may be coupled to the primary and secondary supply domains 102 and 104.

The primary supply domain 102 includes a POR circuit 106 receiving VDDI and the secondary supply domain 104 includes a POR circuit 108 receiving VDDO. The POR circuit 106 holds the primary supply domain 102 in a reset state until released by a primary POR reset signal POR_N_I asserted by the POR circuit 106, and the POR circuit 108 holds the secondary supply domain 104 in a reset state until released by a secondary POR reset signal POR_N_O asserted by the POR circuit 108. As shown, VDDI and POR_N_I are also provided to the POR circuit 108. A bidirectional connection 110 generally represents one or more signal connections between the primary and secondary supply domains 102 and 104. Although not required, the secondary supply domain 104 may perform input/output (110) functions with external devices, such as represented by connection to an I/O pin PIO.

Upon power up or reset, it is desired that the IC 100 enter a known state without asserting spurious signals. The primary supply domain 102 may contain the primary functional circuitry performed by the IC 100, whereas the second supply domain 104, along with any other second supply domains (not shown) on the IC 100, contain secondary or peripheral functions generally controlled by the primary supply domain 102. For example, the IC 100 may be a microcontroller or the like in which the core functions are contained within the primary supply domain 102, whereas the secondary supply domain 104 contain 1/O functions, such as GPIO functions or the like, which are generally controlled by the functions and processes within the primary supply domain 102. As such, it is desired that the primary supply domain 102 exits its reset state before the secondary supply domain 104 to prevent improper or unintended operation. For example, if VDDO ramps before VDDI, the secondary supply domain 104 may become powered before the primary supply domain 102 and may assert spurious or unintended signals via the PIO pin (and/or other external pins) to external devices that may also be powered.

The POR_N_I indicates when the primary supply domain 102 exits reset after VDDI has exceeded a first predetermined threshold level appropriate for VDDI. POR_N_I is provided to hold the secondary supply domain 104 in reset until after the primary supply domain 102 is released from reset. Level shifting POR signals across different supply domains has proved problematic, however, as traditional levelshifter topologies either consume static current or rely on systematic leakage/parasitic capacitor imbalance to define an initial state. Such conventional dynamic-based or parasitic-based schemes often raise concerns of robustness, especially in the case of non-monotonic supply ramps. The POR circuit 108 should hold the secondary supply domain 104 in reset until VDDO has exceeded a second predetermined threshold level appropriate for VDDO and only after POR_N_I has been asserted. In certain POR conditions, such as when VDDI and VDDO ramp up at about the same time, POR_N_I may glitch early that might otherwise cause premature activation of the secondary supply domain.

The POR circuit 108 addresses the multiple-supply domain scenario while residing within the secondary supply domain 104 and sensing the POR circuit 106 of primary supply domain 102 via the POR_N_I signal. The POR circuit 108 generates its own bias current and reference voltage, isolates, and if necessary, level shifts the POR_N_I signal within the secondary supply domain 104, and determines when both VDDO and VDDI have exceeded their respective threshold levels. The advantages of the POR circuit 108, as further described herein, include substantially reduced area and quiescent power consumption compared to conventional techniques, no level shifter reliance on leakage/dynamical imbalance for startup, allows either VDDI or VDDO to ramp up first, and allows VDDI and VDDO to be at the same or different operating DC potentials.

Figure 2:
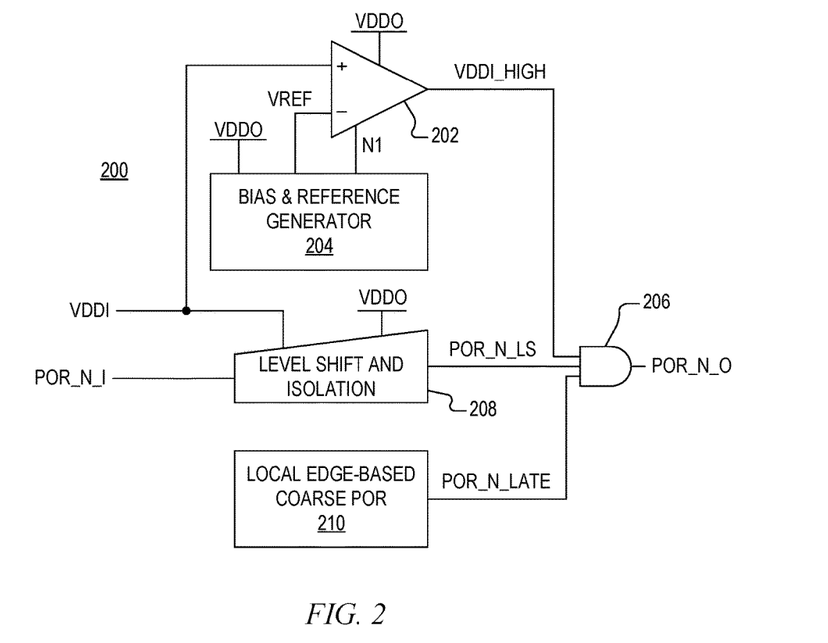
FIG. 2 is a simplified block diagram of a POR circuit according to one embodiment of the present invention that may be used as the POR circuit of FIG. 1.

FIG. 2 is a simplified block diagram of a POR circuit 200 according to one embodiment of the present invention that may be used as the POR circuit 108. A supply voltage comparator 202 is supplied by VDDO, has a first input (e.g., the positive or non-inverting input) receiving VDDI, and has a second input (e.g., the negative or inverting input) receiving a reference voltage VREF from a bias & reference generator 204. The supply voltage comparator 202 has an output providing a compare POR signal VDDI_HIGH to one input of a 3-input logic AND gate 206, and includes a common node N1 with the bias & reference generator 204 for controlling bias current. As described further herein, the bias & reference generator 204 is supplied by VDDO, provides starting current for the comparator 202, and mirrors a bias current controlled by the comparator 202, in which the mirrored bias current is used for developing the reference voltage VREF used for comparison with VDDI by the supply voltage comparator 202.

VDDI and VDDO are also provided to a level shift and isolation circuit 208, which has an input receiving POR_N_I from the POR circuit 106 of the primary supply domain 102, and an output providing a level shifted POR reset signal POR_N_LS to a second input of the AND gate 206. The term "level shift" and its various forms is defined herein in the broadest sense to mean a conversion from one voltage domain (e.g., the primary supply domain 102) to another voltage domain (e.g., the second supply domain 104) regardless of the actual voltage levels of the supply voltages and includes the specific case in which VDDI and VDDO are the same voltage level.

VDDO is further provided to a local edge-based coarse POR circuit 210, having an output asserting a signal POR_N_LATE to a third input of the AND gate 206. The output of the AND gate asserts the POR_N_O signal that controls the reset state of the secondary supply domain 104.

General operation of the POR circuit 200 is now briefly described. VDDI and VDDO may have the same or different operating voltage levels, in which the operating voltage of VDDO may be lower, higher or the same as the voltage of VDDI. VDDI and VDDO may ramp up at different rates and/or at different times upon POR of the IC 100. Three different cases are considered. In a first case, VDDO ramps up before VDDI. The local edge-based coarse POR circuit 210 establishes a delay in response to VDDO ramping up, which may have expired in response to VDDO by the time VDDI begins to ramp up in the first case. Thus, the POR_N_LATE may be asserted first before POR_N_I is asserted. The bias & reference generator 204 provides starting current and develops the reference voltage VREF. The comparator 202 senses the level of VDDI relative to VREF and based on the difference between VDDI and VREF, determines VDDI_HIGH and correspondingly servoes the bias & reference generator 204 between low and high current modes. When VDDI rises above a threshold voltage of VREF, the comparator 202 switches and asserts VDDI_LOW low and VDDI_HIGH high. The bias & reference generator 204 mirrors the reduced bias current to a low quiescent level. When the POR_I circuit has detected that VDDI has risen above a threshold level, it asserts POR_N_I to release the primary supply domain 102 from reset. The level shift and isolation circuit 208 detects POR_N_I asserted and asserts POR_N_LS. Once VDDI_HIGH, POR_N_LS and POR_N_LATE are all asserted, POR_N_O is asserted to release the secondary supply domain 104 from its reset state.

In a second case, VDDI and VDDO ramp up at about the same time or sufficiently close to each other. In this case the comparator 202 does not reliably gate VDDI from the POR circuit 106 and may assert VDDI_HIGH prematurely. The POR circuit 106 asserts POR_N_I when VDDI has reached the first predetermined threshold, so that POR_N_LS is only asserted after the primary domain 102 is released from reset. It is possible, however, that POR_N_LS is asserted before VDDO has reached the requisite threshold level, which might otherwise cause POR_N_O to be asserted prematurely if only based on VDDI_HIGH and POR_N_LS. The local edge-based coarse POR circuit 210, however, monitors VDDO and holds the secondary domain 104 in reset until a predetermined time period after VDDO has reached a threshold level. When this occurs, the local edge-based coarse POR circuit 210 asserts POR_N_LATE to allow POR_N_O to be asserted only after VDDI and VDDO have reached their requisite levels.

In a third case, VDDI ramps up before VDDO. The third case is similar to the second case in that VDDI_HIGH and/or POR_N_LS may be asserted prematurely before VDDO has reached its requisite level. The local edge-based coarse POR circuit 210 ensures that POR_N_O is asserted only after VDDO has reached its requisite level.

Figure 3:
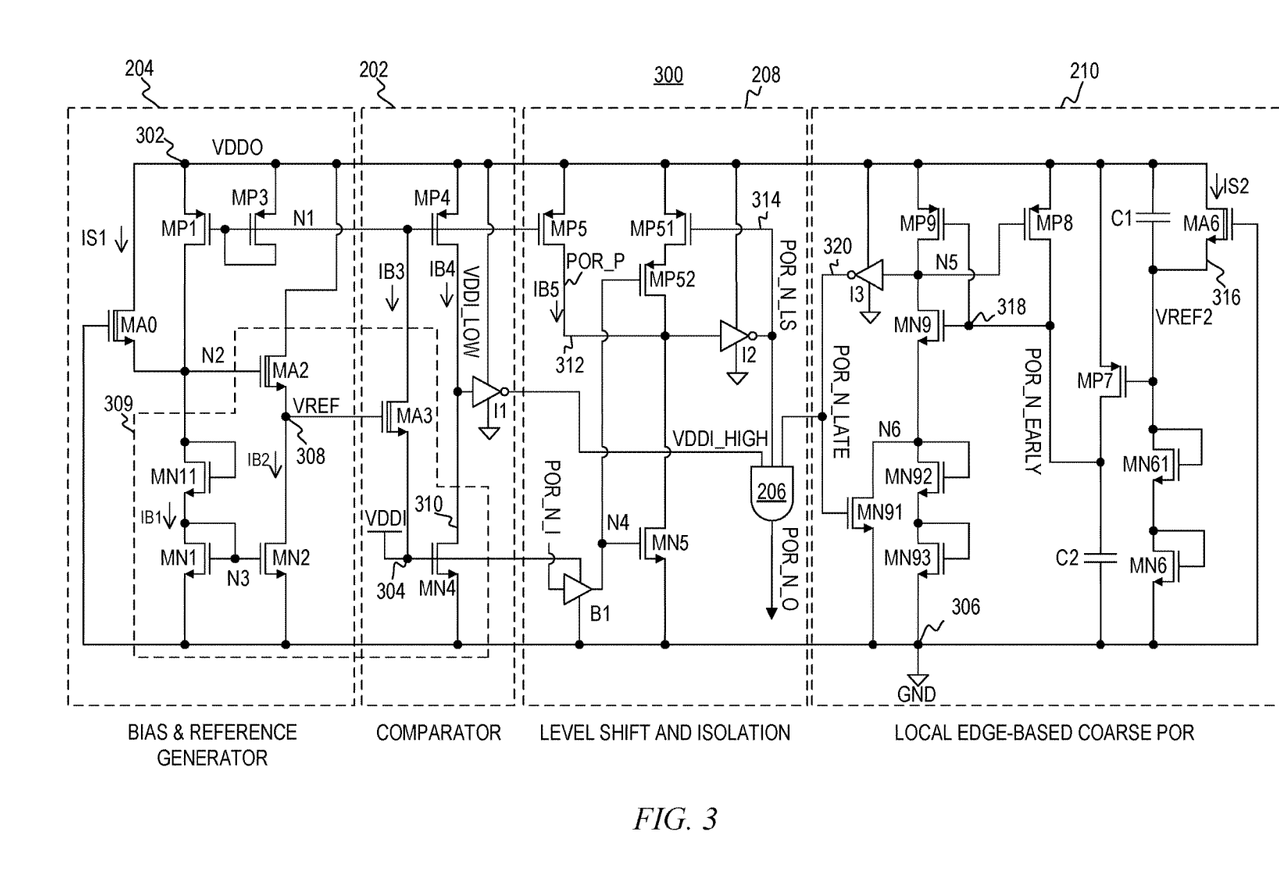
FIG. 3 is a more detailed schematic diagram of a POR circuit according to one embodiment of the present invention that may be used as the POR circuit of FIG. 2 including more specific implementations of the various functions of the POR circuit.

FIG. 3 is a more detailed schematic diagram of a POR circuit 300 according to one embodiment of the present invention which may be used as the POR circuit 200 including more specific implementations of the comparator 202, the bias & reference generator 204, the level shift and isolation circuit 208, and the local edge-based coarse POR circuit 210 of the POR circuit 200. A node 302 receives VDDO, a node 304 receives VDDI and a node 306 is coupled to GND. The POR circuit 108 includes N-channel MOS (NMOS) transistors MA0, MN1, MN11, MA2, MN2, MA3, MN4, MN5, MN9, MN91, MN92, MN93, MA6, MN6 and MN61, P-channel MOS (PMOS) transistors MP1, MP3, MP4, MP5, MP51, MP52, MP7, MP8, and MP9, inverters I1, I2 and I3, a buffer B1, the AND gate 206, and capacitors C1 and C2. The MOS transistors labeled "MA" denote low threshold voltage (VT) NMOS transistors, including MA0, MA2, MA3 and MA6. The low VT NMOS transistor MA0, MA2, MA3 and MA6 are shown with a modified CMOS symbol having a double channel line between the drain and source terminals. The inverters I1, I2, and I3, and the AND gate 206 are each supplied by the VDDO domain, meaning that each has an upper supply voltage terminal coupled to VDDO and a lower supply voltage terminal coupled to GND. B1 is supplied by the VDDI domain and has supply terminals coupled between VDDI and GND.

The bias & reference generator 204 includes MA0, MP1, MP3, MN11, MN1, MA2, and MN2. VDDO is coupled to the drain terminals of MA0 and MA2 and to the source terminals of MP1 and MP3. MP1 has its gate terminal coupled to the node N1 and its drain terminal coupled to a node N2. MP3 is diode-coupled having its gate and drain terminals coupled to node N1. MA0 has its gate terminal coupled to GND and its source terminal coupled to node N2, which is further coupled to the gate terminals of MA2 and MN11. MN11 has its source terminal coupled to the drain terminal of MN1 and to a node N3, which is further coupled to the gate terminals of MN1 and MN2. The source terminals of MN1 and MN2 are coupled to GND. MA2 has its source terminal coupled to a node 308 developing the reference voltage VREF, which is further coupled to the drain terminal of MN2. MN11 and MN1 are both diode-coupled (gate and drain terminals coupled together). MN1 and MN2 are coupled in a current mirror configuration in which a bias current IB1 flowing through MN1 is mirrored as a bias current IB2 flowing through MA2 and MN2. MA0 is shown providing a startup current IS1 as further described herein.

The comparator 202 includes MP4, MA3, MN4 and the inverter I1. VDDO is coupled to the source terminal MP4. MP3 has its gate and drain terminals coupled together at node N1, which is further coupled to the drain terminal of MA3. MA3 has its gate terminal coupled to node 308 receiving VREF, and its source terminal coupled node 304 receiving VDDI, which is provided to the gate terminal of MN4. The drain terminals of MP4 and MN4 are coupled together at a node 310 developing a signal VDDI_LOW, which is further coupled to the input of the inverter I1 having its output providing the VDDI_HIGH signal. The source terminal of MN4 is coupled to GND. The output of the inverter I1 provides the signal VDDI_HIGH, which is provided to one input of the AND gate 206. MP1 forms a mirror configuration with MP3, so that the bias current IB3 flowing through MP3 and MA3 is mirrored as the bias current IB1 flowing through MP1. MP3 and MP4 have commonly connected gate and source terminals, so that IB3 is also mirrored as another bias current IB4 flowing through MP4.

MA2, MA3, MN4, MN11 and MN1 form a VGS loop 309 for establishing the reference voltage VREF. The term "VGS" refers to the gate to source voltage of a field-effect transistor (FET) or a MOS transistor, so that the VGS loop 309 is formed by a voltage loop of the VGS voltages of the transistors. Beginning at GND, node N3 is separated from GND by the VGS of MN1, node N2 is separated from node N3 by the VGS of MN11, node 308 developing VREF is separated from node N2 by the VGS of MA2, and VDDI is separated from node 308 by the VGS of MA3. The VGS loop 309 may be completed from node 304 back to GND via the VGS MN4. As described further herein, the bias current IB3 is developed and controlled by the comparator 202 and flowing through MA3 is mirrored as IB1 through MN11 and MN1 and is mirrored as IB2 through MA2.

The level shift and isolation circuit 208 includes MP5, MP51, MP52, and MN5, the buffer B1, and the inverter I2. VDDO is coupled to the source terminals of MP5 and MP51. MP5 has its gate terminal coupled to node N1 and its drain terminal coupled to a node 312 developing a signal POR_P, which is further coupled to the drain terminals of MP52 and MN5 and to the input of the inverter I2. MP51 has its gate terminal coupled to a node 314 which develops the POR_N_LS signal, and has its drain terminal coupled to the source terminal of MP52. The POR_N_I signal is provided to the input of the buffer B1, having its output coupled to the gate terminals of MP52 and MN5. The source terminal of MN5 is coupled to GND. The output of the inverter I2 develops the POR_N_LS signal on node 314, which is provided to the gate of MP51 and to one input of the AND gate 206. MP4 and MP5 have commonly connected gate and source terminals, so that IB3 may be mirrored as another bias current IB5 flowing through MP5 (when MP5 is not in its triode region of operation).

The local edge-based coarse POR circuit 210 includes MA6, MN6, MN61, MP7, MP8, MP9, MN9, MN91, MN92, MN93, the inverter I3, and the capacitors C1 and C2. VDDO is provided to the drain terminal of MA6, to the source terminals of MP7, MP8 and MP9, and to one terminal of the capacitor. MA6 has its gate terminal coupled to GND and its source terminal coupled to a node 316 developing a second reference voltage VREF2, which is provided to the other terminal of C1, to the gate terminals of MP7 and MN61, and to the drain terminal of MN61. The source terminal of MN61 is coupled to the gate and drain terminals of MN6, which has its source terminal coupled to GND. MN6 and MN61 are each diode-coupled and collectively form a voltage offset circuit for developing VREF2. The drain terminal of MP7 is coupled to a node 318 developing a signal POR_N_EARLY. Node 318 is further coupled to one end of the capacitor C2, to the drain terminal of MP8 and to the gate terminals of MP9 and MN9. The other terminal of C2 is coupled to GND. A node N5 is coupled to the drain terminals of MP9 and MN9, to the input of the inverter I3, and to the gate terminal of MP8. A node N6 is coupled to the source terminal of MN9, to the drain terminals of MN91 and MN92 and to the gate terminal of MN92. The source terminal of MN92 is coupled to the gate and drain terminals of MN93. The source terminals of MN91 and MN93 are coupled to GND. The output of the inverter I3 is coupled to a node 320 developing the POR_N_LATE signal, which is provided to the gate of MN91 and to one input of the AND gate 206. MN61, MN6, MN92 and MN93 are each diode-coupled. The output of the AND gate 206 provides the POR_N_O signal as previously described.

MN92 and MN93 are each diode-coupled to form a voltage offset circuit to allow for additional hysteresis based on switching of MN91 by POR_N_LATE. In an alternative embodiment, the source terminal of MN9 may be coupled to ground and the transistors MN91, MN92 and MN93 eliminated.

The bias & reference generator 204 mirrors the bias current IB used for developing the reference voltage VREF, which includes the bias current IB1 flowing through MN11 and MN1, the bias current IB2 flowing through MA2 and MN2, the bias current IB3 flowing through MP3 and MA3, and the bias current IB4 flowing through MP4. The bias current IB is mirrored as each of the separate bias currents in each current leg, in which IB=IB1=IB2=IB3=IB4. Although MP5 is also in a mirror configuration similar to MP4, the bias current IB5 may be less while MP5 is in its triode region as further described herein.

MA3 forms the input of the comparator 202 for comparing VREF with VDDI reflected as VDDI_LOW on node 310. In one embodiment, VDDI_LOW is inverted as VDDI_HIGH provided to the AND gate 206. POR_N_I is buffered through B1 to control both MP52 and MN5 for developing POR_P on node 312. POR_P is inverted through I2 to develop POR_N_LS on node 314 provided to the AND gate 206. The rise of VDDO primarily controls operation of the local edge-based coarse POR circuit 210. The state of node N5 generally controls the state of POR_N_LATE at the output of the inverter I3 in which POR_N_LATE is provided to the AND gate 206. POR_N_EARLY is initially held low by C2 until MP7 turns on and begins charging C2. After a delay time period as further described herein, MN9 turns on to pull N5 low and POR_N_LATE high. More specific circuit operation is described in relation to the timing diagrams of FIGS. 4 and 5.

Although not shown in FIG. 3, additional circuit enhancements such as adding capacitors to supply or ground at key nodes so as to enhance the transient response of the circuit or reference-voltage shifts by varying the number of stacked devices (e.g., stacked diodes) in the VGS loop 309 (e.g., MN11/MN1 and/or MA2/MN2) or in subsequent comparator or level shift stages are possible and contemplated. The use of low VT devices MA0 and MA6 are particularly advantageous to provide the startup currents IS1 and IS2 to initiate circuit operation during POR. The low VT devices MA2 and MA3 are also advantageous to reduce the minimum supply at which the circuit reliably operates.

In an alternative embodiment, the inverter I1 may be eliminated in which the AND gate 206 may be simplified to a 2-input control gate. The state of the comparator 202 does control the activation of the reset state of the secondary supply domain 104 in certain conditions, but may do so by control of the bias current IB. When the bias current is relatively high, MP5 pulls POR_P high so that the level shift and isolation circuit 208 is in its isolation state to isolate POR_N_I provided by the primary supply domain 104. When the comparator 202 switches, it reduces the bias current IB to its low quiescent state, and the level shift and isolation circuit 208 transitions from its isolation state to its transparent state so that that state of POR_N_I may determine the reset state of the secondary supply domain 104 as further described herein.

Figure 4:
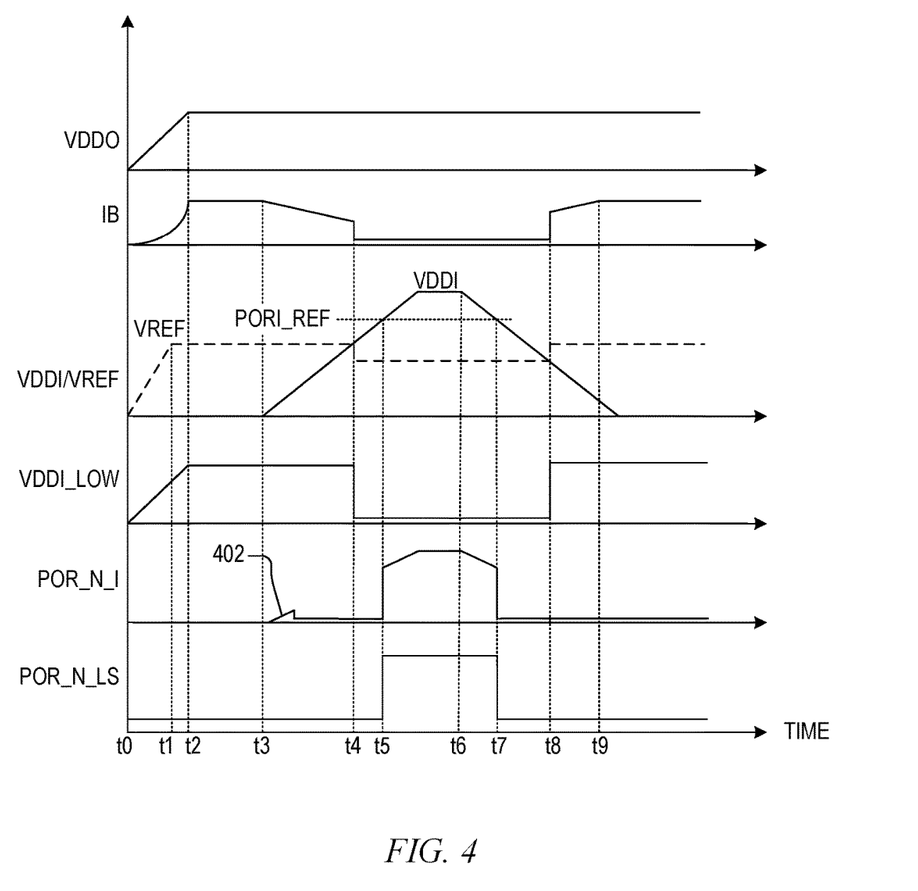
FIG. 4 is a timing diagram illustrating operation of the POR circuit of FIG. 3 according to one embodiment of the present invention for the first case when VDDO ramps before VDDI.

FIG. 4 is a timing diagram illustrating operation of the POR circuit 300 according to one embodiment of the present invention for the first case when VDDO ramps before VDDI. VDDO, IB, VDDI and VREF, VDDI_LOW, POR_N_I and POR_N_LS are plotted versus time. VDDI and VREF are plotted together to more clearly illustrate operation of the comparator 202. Initially at a time t0, VDDO and VDDI are low. After t0, VDDO begins to rise while VDDI is still low. As VDDO rises, MA0 turns on and provides a startup current IS1 through MA0 to turn on MA2 and MA3. As previously described, MA0, MA2 and MA3 may each be low VT devices meaning that they conduct current as soon as they develop any positive VGS voltage. As soon as VDDO reaches a minimum level above GND, the startup current IS1 flows from MA0 through the gate and source terminals of MA2 and MA3 to begin circuit operation. The low VT devices are configured as source followers so that the circuit may operate at a low supply voltage level. As VDDO rises while POR_P is still low, since MP5 is in a current mirror configuration with MP3, the bias current is mirrored as IB5 and MP5 is initially in its saturation region to begin charging up POR_P.

Since VDDI is still low, VREF is developed at an initial positive value and hence establishes the VGS of MA3 to initiate the bias current IB3 through MA3. MP1 and MP3 are in a mirrored configuration (MP1 has same VGS as MP3), so that IB3 is mirrored as IB1 flowing through MP1. IB1 flows through MN11 and MN1 to develop voltage on node N2, which sets the gate voltage of MA2. As the voltage of MA0 rises above zero, the VGS of MA0 goes negative and MA0 is turned off so that IS1 goes to zero. MN2 is in a mirrored configuration with MN1, so that IB1 is mirrored as IB2 flowing through MA2 and MN2. MA2 adjusts its source voltage, or VREF, as the voltage at N2 minus the VGS of MA2, in which the VGS of MA2 is determined by the bias current IB2. VREF reaches a peak level at about time t1, and the adjusted VREF value modifies the VGS of MA3, which in turn modifies the bias current IB3, thus completing the VGS loop 309. VDDO settles at its final level at about time t2, and since VDDI is still low while VREF is established, MA3 conducts a large amount of current and IB reaches a relatively high current level throughout the circuit. The bias current IB3 is mirrored as IB4 through MP4 so that VDDI_LOW rises to a high level at time t2. It is noted that VDDI_HIGH is initially low and stays low during this time while VDDI_LOW goes high.

As noted above, MA3, MA2, MN11 and MN1 form the VGS loop 309 with mirrored current IB=IB1=IB2=IB3, in which IB is determined according to the following equation (1):

$$IB = \frac{1}{2}\left(\frac{V_{Tn} - V_{Tnat} - VDDI/2}{K_{nat}^{-1/2} - K_n^{-1/2}}\right)^2 \quad (1)$$

in which $K_{nat}$ is the transconductance parameter and $V_{Tnat}$ is the threshold voltage for the low VT NMOS transistors including MA2 and MA3, and in which $K_n$ is the transconductance parameter and $V_T n$ is the threshold voltage for the regular NMOS transistors including MN11, MN1, MN2 and MN4. Also, VREF is established according to the following equation (2):

$$VREF = 2V_{Tn} - V_{Tnat} + \sqrt{2IB}(2K_n^{-1/2} - K_{nat}^{-1/2}) \quad (2)$$

It is understood that while VDDO is high and VDDI is low just after time t2, IB is high so that the bias & reference generator 204 momentarily consumes a relatively large amount of power. Yet it is also understood that this condition exists for only a relatively short period of time during POR while VDDI is low but will soon ramp up.

The degree of freedom to consume large current when VDDI is low allows for relatively small MOS aspect ratios and potentially eliminates need for large resistor values. In fact, the POR circuit 300 shown in FIG. 3 does not use resistors at all. In one embodiment, each of the N-channel and P-channel MOS transistor devices, including MAX, MNX, and MPX (in which X denotes a distinguishing reference number), may be implemented with a "small" aspect ratio of width (W) to length (L), or W/L or L/W. As used herein, a small aspect ratio defined as an aspect ratio that is at or close to one (e.g., W/L z 1). The elimination of resistors and the use of small aspect devices reduces overall area consumption of the circuit and allow for substantial area savings. Also, in low-power mode, when VDDI>VREF-$V_{Tnat}$ (in which $V_{Tnat}$ is the threshold voltage of MA3), the bias & reference generator 204 can consume negligible current, such as sub-nA (nanoamperes) in the illustrated embodiment shown, which is orders of magnitude below that of conventional POR circuits.

While VDDI is low and VDDO is high, the node N4 level may generally be low but is not well defined. As POR_P rises in response to the bias current IB5 through MP5, MP5 is pulled into its triode region which reduces the level of IB5 below the mirrored current level. Nonetheless, POR_P is pulled high, so that the inverter I2 pulls POR_N_LS low. The local edge-based coarse POR circuit 210 controls POR_N_LATE based only on VDDO, so that after VDDO is asserted high and while VDDI is low or still ramping up, POR_N_LATE may be asserted high before either VDDI_HIGH or POR_N_LS. This is inconsequential, since the comparator 202 generally dictates the POR condition of the secondary supply domain 104 when VDDO ramps up before VDDI.

At a subsequent time t3, VDDI begins ramping up. As VDDI rises, the bias current IB3 through MA3 begins to slowly decrease. When VDDI reaches VREF-$V_{Tnat}$ (in which $V_{Tnat}$ is set to 0 in the timing diagram for ease of illustration) at about time t4, MN4 begins turning on and when MN4 turns fully on, the comparator 202 switches VDDI_LOW low and VDDI_HIGH high. MA3 of the comparator 202 causes the current IB3 (and thus the bias current IB) to drop to the low quiescent level, and the transistor VGS values in the VGS loop of MA3, MA2 MN11 and MN1 decrease slightly causing a reduction of VREF at time t4. The reduction of VREF establishes a hysteretic function which helps to minimize comparator chatter when VDDI is at or near VREF-$V_{Tnat}$. Also, as IB5 decreases through MP5, the level shift and isolation circuit 208 transitions from its isolation state to its transparent state to allow subsequent level shifting of the POR_N_I signal from the POR circuit 106.

The POR circuit 106 incorporates the first predetermined threshold level, shown as PORI_REF in FIG. 4. When VDDI exceeds PORI_REF at about time t5, the POR circuit 106 asserts POR_N_I high to release the primary supply domain 102 from reset. In response, B1 asserts node N4 high turning off MP52 while turning on MN5 to pull POR_P low and POR_N_LS high. Once POR_N_LS is asserted high and assuming that POR_N_LATE has already been asserted high, and once VDDI_HIGH is asserted high if the inverter I1 is provided, the AND gate 206 asserts POR_N_O high to release the secondary supply domain 104 from reset.

It is noted that POR_N_I may glitch just after time t3 as shown at 402. Even so, the level shift and isolation circuit 208 is held in isolation at this time since POR_P is pulled high, so that POR_N_LS remains low in spite of any such glitch 402 of POR_N_I. The comparator 202 also holds VDDI_HIGH low to keep POR_N_O low. In an embodiment in which the inverter I1 is not provided so that VDDI_HIGH is not provided to the AND gate 206, operation is substantially the same since the level shift and isolation circuit 208 is nonetheless held in isolation at this time. Alternative isolation configurations are considered herein.

At subsequent time t6, VDDI starts to go back low while VDDO remains high. At subsequent time t7, VDDI crosses the PORI_REF threshold so that the POR circuit 106 pulls POR_N_I low so that the primary supply domain 102 is back in its reset state. The level shift and isolation circuit 208 pulls POR_N_LS low in response at about time t7 to also place the secondary supply domain 104 back into its reset state. In this manner, if VDDI drops below a threshold value during operation, both supply domains 102 and 104 are placed back into their reset state at about the same time. When VDDI crosses the lower voltage level of VREF at subsequent time t8, MA3 of the comparator 202 switches and VDDI_LOW is pulled back high while VDDI_HIGH is pulled back low. IB jumps back to a high current level, and VREF increases back to its higher level at about time t8 according to the hysteretic function. IB eventually increases to its maximum level when VDDI is minimally low as shown at time t9. Although this is a high current/power state, it is presumed that VDDO is subsequently pulled low to minimize power consumption.

Figure 5:
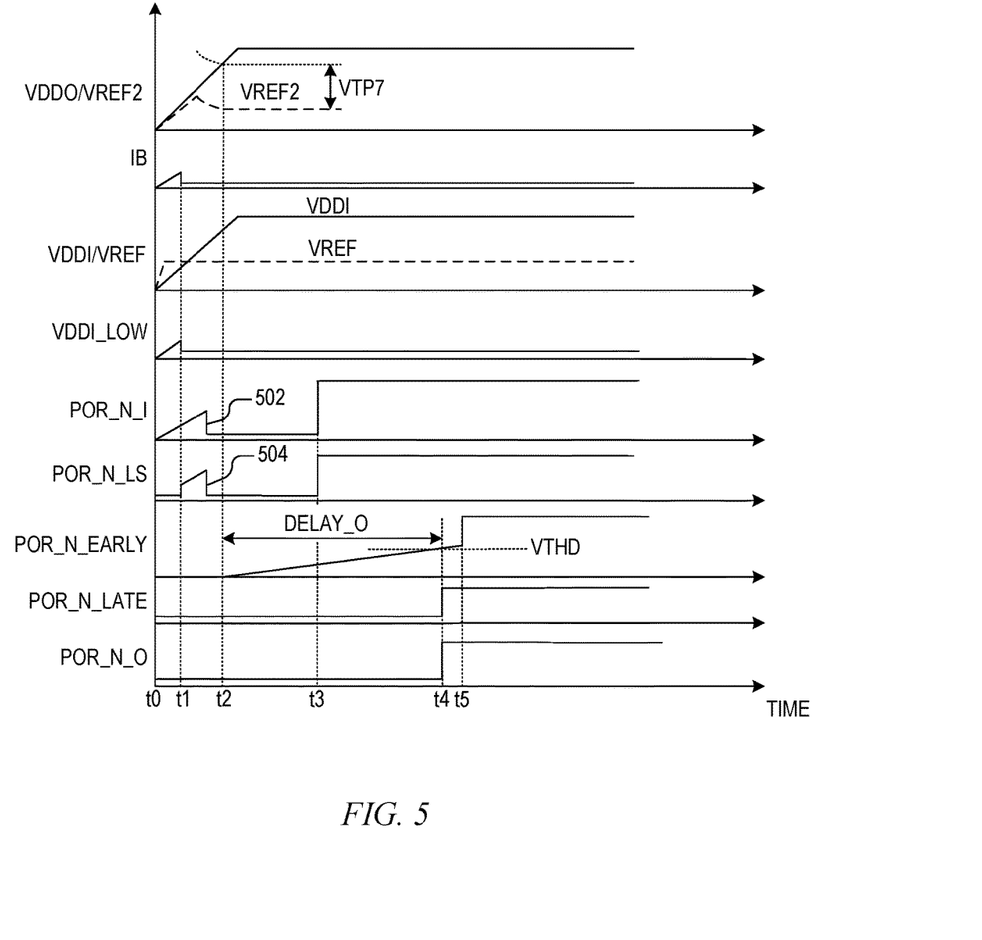
FIG. 5 is a timing diagram illustrating operation of the POR circuit of FIG. 3 according to one embodiment of the present invention for the second case in which VDDO and VDDI ramp up at about the same time.

FIG. 5 is a timing diagram illustrating operation of the POR circuit 300 according to one embodiment of the present invention for the second case in which VDDO and VDDI ramp up at about the same time. In this case, VDDO and VREF2, IB, VDDI and VREF, VDDI_LOW, POR_N_I, POR_N_LS, POR_N_EARLY, POR_N_LATE and POR_N_O are plotted versus time. VDDO and VREF2 are plotted together, and VDDI and VREF are also plotted together. At time t0, VDDO and VDDI begin ramping up at the same time. As VDDO rises, MA0 begins providing the startup current IS1 to the bias & reference generator 204. IB begins to increase, and VREF also begins to rise. Since VDDI is also rising, however, VDDI is at or near the supply comparator threshold VREF, so that MA3 may not turn fully on which may limit the magnitude of IB. As VDDI rises, MN4 begins turning on. In this case, VREF reaches a lower voltage level and while VDDI continues to increase, at about time t1 IB falls to its lower quiescent level. VDDI_LOW initially begins rising, but is either indeterminate, or at about time t1, goes low and remains low. The inverter I1, if provided, may pull VDDI_HIGH high prematurely. Also, the comparator 202 does not properly gate POR_N_I, so that if POR_N_I glitches high as shown at 502, since IB5 is sufficiently low reducing the level of isolation, the inverter I2 may also cause POR_N_LS to glitch high as shown at 504. Without additional masking function, this might otherwise cause POR_N_O to be prematurely asserted high before VDDO has reached the second predetermined threshold. The local edge-based coarse POR circuit 210, however, prevents POR_N_O from being prematurely asserted high.

As VDDO begins to ramp beginning at time t0, the capacitor C1 causes VREF2 to initially follow VDDO so that MP7 remains off. The capacitor C2 initially holds POR_N_EARLY low. MP9 turns on to hold node N5 high so that the inverter I3 initially holds POR_N_LATE low. When VDDO begins to rise, MA6 turns on to provide startup current IS2 to node 316 developing the voltage VREF2. MN61 and MN6 turn on so that VREF2 no longer follows VDDO but decreases to its steady-state level at about time t2. At this time MA6 is turned off. Once VDDO rises above VREF2 plus the threshold voltage of MP7, shown as VTP7, or when VDDO>VREF2+VTP7 at about time t2, then MP7 begins turning on to begin charging the capacitor C2. As C2 charges, POR_N_EARLY begins increasing after time t2. The capacitance of the capacitor C2 and the size of MP7 are selected to cause C2 to rise slowly to form a time delay from time t2 to a time t4, shown as DELAY_O. Meanwhile, at about a time t3 after VDDI has stabilized high, POR_N_I and POR_N_LS are both asserted high. POR_N_O, however, remains low since POR_N_LATE is still low.

MN92 and MN93, if provided, are both diode-connected forming a voltage offset circuit to establish a double VGS drop at the source terminal of MN9. At time t4 when POR_N_EARLY rises to a voltage threshold VTHD sufficient to turn on MN9, MN9 turns on and pulls now N5 low so that the inverter I3 switches to pull POR_N_LATE high. The AND gate 206 thus pulls POR_N_O high at time t4 in response to POR_N_LATE going high, so that the secondary supply domain 104 is pulled out of reset. Also, when POR_N_LATE is pulled high, it turns on MN91 which shorts the double VGS drop across MN92 and MN93 to clamp MN9 fully on. MP8 is turned fully on to increase the current to charge the capacitor C2, so that POR_N_EARLY is pulled fully high at subsequent time t5. MP8 operates as a keeper device to keep POR_N_EARLY pulled high. Because MP7 is weakly biased by VREF2, activating keeper MP8 ensures that supply noise or subsequent ramps of VDDO do not cause spurious toggles of POR_N_LATE.

FIG. 5 shows POR_N_I and POR_N_LS rising at a time t3 before time t4. In some configurations or in some cases, POR_N_I and POR_N_LS may rise later, even after time t5. In that case, POR_N_O does not rise in response to POR_N_LATE but rises later in response to POR_N_LS asserted high because of the operation of the AND gate 206.

The third case, in which VDDI ramps before VDDO, is similar to the second case. The comparator 202 may assert VDDI_HIGH high prematurely and/or B1 may hold the input of the inverter I2 low while VDDO rises such that POR_N_LS may also go high prematurely before VDDO reaches a sufficient threshold. Regardless of the states of VDDI_HIGH and POR_N_LS, the local edge-based coarse POR circuit 210 operates in substantially the same manner as shown in FIG. 5 to hold POR_N_LATE low until after POR_N_EARLY reaches VTHD after the time delay DELAY_O at time t4, which does not even begin until VDDO reaches it threshold level at time t2. Right after POR_N_LATE switches high after the delay, the AND gate 206 asserts POR_N_O high.

Figure 6:
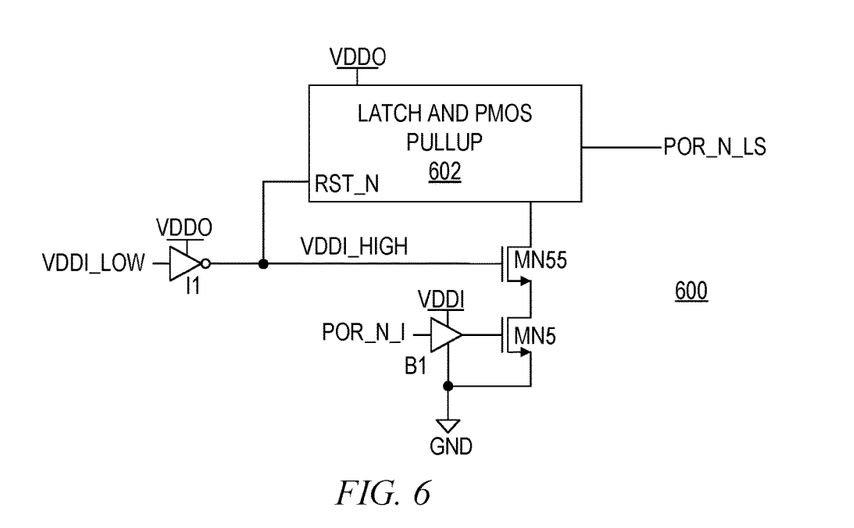
FIG. 6 is a simplified schematic and block diagram of a level shift and isolation circuit illustrating an alternative embodiment of the level shift and isolation circuit shown in FIG. 3.

FIG. 6 is a simplified schematic and block diagram of a level shift and isolation circuit 600 illustrating an alternative embodiment of the level shift and isolation circuit 208 shown in FIG. 3. The buffer B1 is coupled in a similar manner, is supplied by VDDI, has an input receiving POR_N_I and has an output coupled to the gate terminal of MN5. In this case, an NMOS transistor MN55 has its drain and source terminals coupled in series between a control input of a latch and PMOS pullup circuit 602 and the drain terminal of MN5. The drain terminal of MN55 is coupled to the control input of the PMOS pullup circuit 602 to control its latched state. VDDI_HIGH is provided to the gate terminal of MN55 and to an inverted reset input of the latch and PMOS pullup circuit 602, which outputs the POR_N_LS signal.

In this case, rather than using the bias current IB to control MP5 to establish isolation, and rather than providing VDDI_HIGH to an input of the AND gate 206, VDDI_HIGH instead acts as an explicit isolation signal. In this case, VDDI_HIGH is used to block MN5 from contending with MP5 and/or other pullup PMOS devices (within the latch and PMOS pullup circuit 602) in the event that POR_N_I glitches or is at an indeterminate logic value before VDDI is sufficiently high. When VDDI_HIGH is low, MN55 is off. The VDDI_HIGH signal is also used to reset the latch and PMOS pullup circuit 602 into a known initial state during isolation. When VDDI_HIGH is low, the POR_N_LS signal is held low. When VDDI_LOW goes low pulling VDDI_HIGH high, the latch and PMOS pullup circuit 602 is released from reset and its state is dictated by POR_N_I via MN55. In this case, when POR_N_I goes high, MN5 is turned on and if MN55 is also on (when VDDI_HIGH is also high), the latch and PMOS pullup circuit 602 pulls POR_N_LS high. Thus, VDDI_HIGH and POR_N_I work in tandem through the latch and PMOS pullup circuit 602 to control the state of POR_N_LS. Also, VDDI_HIGH is not provided to the AND gate 206, which may instead be configured as a 2-input AND gate.

Figure 7:
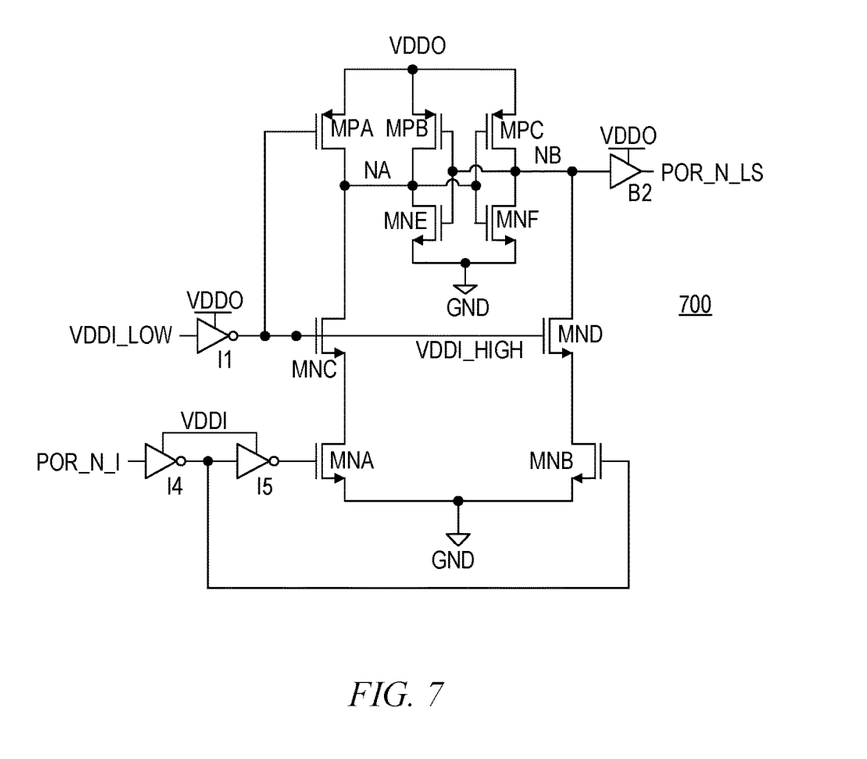
FIG. 7 is a more detailed schematic diagram of a level shift and isolation circuit 700 illustrating another alternative embodiment of the level shift and isolation circuit shown in FIG. 3.

FIG. 7 is a more detailed schematic diagram of a level shift and isolation circuit 700 illustrating another alternative embodiment of the level shift and isolation circuit 208 shown in FIG. 3. In this case, POR_N_I is provided to the input of an inverter I4, which has an output providing an inverted primary POR signal (inverted version of POR_N_I) to the input of another inverter I5 and to the gate terminal of an NMOS transistor MNB, in which both inverters I4 and I5 are supplied by VDDI. The output of the inverter I5 provides a buffered primary POR signal (buffered version of POR_N_I) to the gate terminal of another NMOS transistor MNA. The source terminals of MNA and MNB are coupled to GND. VDDI_HIGH is provided to the gate terminals of NMOS transistors MNC and MND, in which the source terminal of MNC is coupled to the drain terminal of MNA and the source terminal of MND is coupled to the drain terminal of MNB. The isolation and latch circuit further includes PMOS transistors MPA, MPB and MPC and NMOS transistors MNE and MNF. The source terminals of MPA, MPB and MPC are coupled to VDDO. VDDI_HIGH is provided to the gate terminal of MPA, having its drain terminal coupled to a node NA, which is further coupled to the drain terminals MPB, MNC and MNE and to the gate terminals of MPC and MNF. The drain terminal of MPC is coupled to a node NB, which is further coupled to the drain terminals of MNF and MND, to the gate terminals of MPB and MNE and to the input of another buffer B2 supplied by VDDO. The source terminals of MNE and MNF are coupled to GND. The output of B2 asserts POR_N_LS.

The level shift and isolation circuit 700 operates in a similar manner as the level shift and isolation circuit 600, in which VDDI_HIGH acts as an explicit isolation signal rather than using the bias current IB to control MP5 to establish isolation, or rather than providing VDDI_HIGH to an input of the AND gate 206. In this case, as long as VDDI_LOW is high, VDDI_HIGH is low turning off MNC and MND isolating the lower circuit receiving POR_N_I. Any initial glitches of POR_N_I are isolated and thus inconsequential. While VDDI_HIGH is low, it acts as a reset by turning on MPA which pulls NA high and NB low, so that POR_N_LS is pulled low. When VDDI_LOW is pulled low pulling VDDI_HIGH high, MNC and MND are turned on to remove isolation so that the state of the upper latch depends upon the state of POR_N_I. If POR_N_I is still low, then MNA is off and MNB is on keeping NB and POR_N_LS low. When POR_N_I goes high, MNA is turned on while MNB is turned off, which switches the upper latch so that NA goes low and NB and POR_N_LS both go high. VDDI_HIGH and POR_N_I work in tandem via the latch circuit to determine the state of POR_N_LS. Also, VDDI_HIGH is not provided to the AND gate 206, which may instead be configured as a 2-input AND gate.

Figure 8:
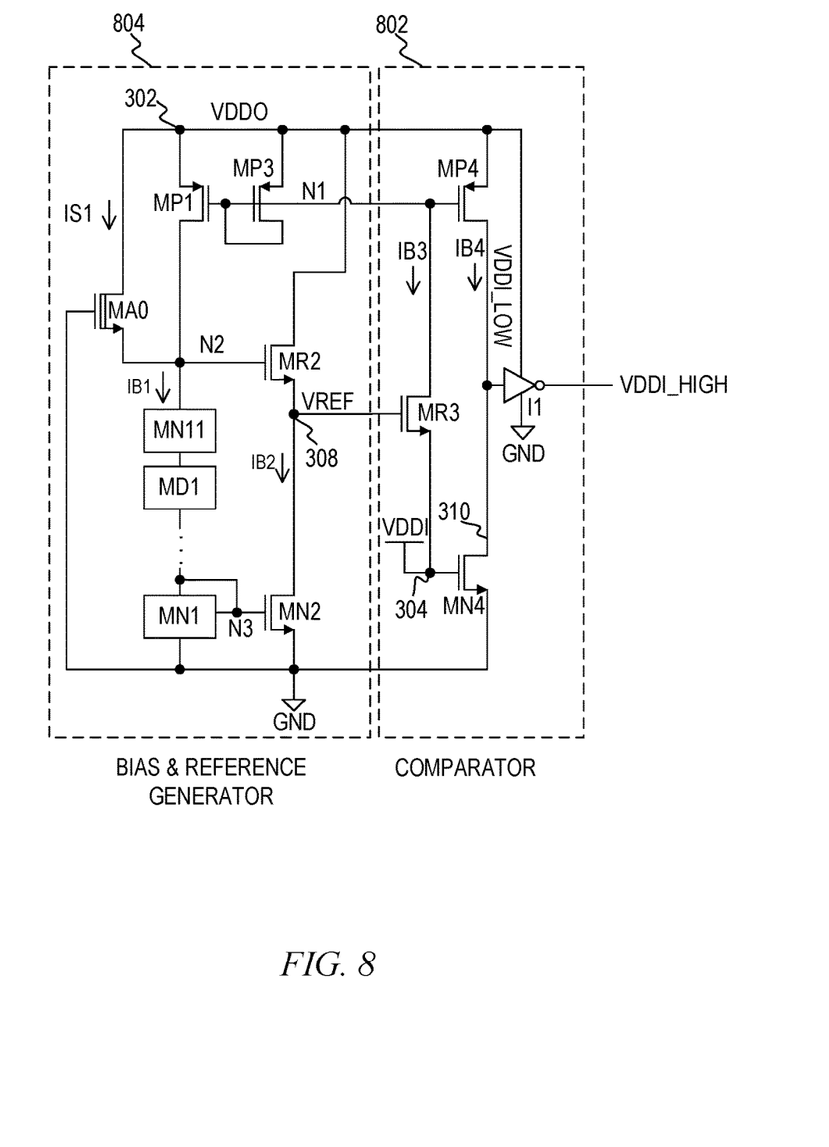
FIG. 8 is a schematic diagram of a comparator and a bias & reference generator according to an alternative embodiment of the present invention for configurations in which supply voltage headroom is less of an issue.

FIG. 8 is a schematic diagram of a comparator 802 and a bias & reference generator 804 according to an alternative embodiment of the present invention for configurations in which supply voltage headroom is less of an issue. The comparator 802 may replace the comparator 202 and the bias & reference generator 804 may replace the bias & reference generator 204 of the POR circuit 300 of FIG. 3. The bias & reference generator 804 is substantially similar to the bias & reference generator 204, except that the low VT transistor MA2 is replaced by a standard or regular VT transistor MR2, such as similar to MN2 or MN4. Also, MN1 and MN11 are each diode-coupled in the same manner but shown in simplified form stacked between node N2 and ground, and at least one additional diode-coupled transistor MD1 is included in the stack. The comparator 802 is substantially similar to the comparator 202, except that the low VT transistor MA3 is replaced by a standard or regular VT transistor MR3. The stacked devices MN1 and MN11 thus may include one or more additional devices to establish the appropriate voltage at N2 for proper operation of the standard VT devices replacing MA2 and MA3.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A power-on reset (POR) circuit for a secondary supply domain of an integrated circuit comprising a primary supply domain receiving a primary supply voltage and the secondary supply domain receiving a secondary supply voltage, said POR circuit comprising:
  a bias and reference circuit that develops a startup current in response to ramping up of the secondary supply voltage, and that mirrors a bias current into a plurality of transistors coupled into a voltage loop which establishes a reference voltage;
  a comparator receiving said bias current, having a first input receiving said reference voltage and having a second input receiving the primary supply voltage, wherein said comparator controls a level of said bias current to a high current level when said reference voltage is greater than the primary supply voltage by more than a predetermined voltage offset and to a low current level when the primary supply voltage is at least said reference voltage less said predetermined voltage offset;
  a level shift and isolation circuit that is pre-biased upon startup to isolate a primary POR signal from the secondary supply domain while said bias current is above said low current level, and after said bias current achieves said low current level, that transitions to provide said primary POR signal as a level shifted primary POR signal when said primary POR signal indicates that said primary supply domain is out of reset;
  a delay circuit supplied by the secondary supply voltage, wherein said delay circuit provides a delayed secondary POR signal a predetermined time period after the secondary supply voltage achieves a predetermined voltage threshold; and
  a control gate that determines a reset state of the secondary power domain based on said level shifted primary POR signal and said delayed secondary POR signal.

2. The POR circuit of claim 1, wherein:
  said bias and reference circuit comprises a first PMOS transistor having a source terminal coupled to the secondary supply voltage and having a gate terminal and a drain terminal coupled together at a first node; and
  wherein said comparator comprises a first NMOS transistor having a drain terminal coupled to said first node, having a source terminal coupled the primary supply voltage, and having a gate terminal receiving said reference voltage, wherein said first NMOS transistor comprises a low threshold voltage NMOS transistor;
  wherein said first PMOS transistor provides said bias current to said low threshold voltage NMOS transistor via said first node.

3. The POR circuit of claim 2, wherein said bias and reference circuit, comprises:
  a second PMOS transistor having a source current terminal coupled to the secondary supply voltage, having a gate terminal coupled to said first node, and having a drain terminal coupled to a second node;
a second NMOS transistor having a drain terminal and a gate terminal coupled together at said second node and having a source terminal coupled to a third node;
a third NMOS transistor having a drain terminal and a gate terminal coupled together at said third node and having a source terminal coupled to ground;
a fourth NMOS transistor having a drain terminal coupled to the secondary supply voltage, having a gate terminal coupled said second node, and having a source terminal coupled to said reference voltage, wherein said fourth NMOS transistor comprises a low threshold voltage NMOS transistor; and
a fifth NMOS transistor having a drain terminal coupled to said reference voltage, having a gate terminal coupled said third node, and having a source terminal coupled to ground.

4. The POR circuit of claim 3, further comprising a sixth NMOS transistor having a drain terminal coupled to the secondary supply voltage, having a source terminal coupled to said second node, and having a gate terminal coupled to ground, wherein said sixth NMOS transistor comprises a low threshold voltage NMOS transistor providing said startup current.

5. The POR circuit of claim 2, wherein said comparator further comprises:
a second PMOS transistor having a source terminal coupled to the secondary supply voltage, having a drain terminal coupled to a comparator output node, and having a gate terminal coupled to said first node, wherein said second PMOS transistor mirrors said bias current to said comparator output node; and
a second NMOS transistor having a drain terminal coupled to said comparator output node, having a source terminal coupled to ground, and having a gate terminal coupled to the primary supply voltage;
wherein said comparator output node is pulled high via said second PMOS transistor while said bias current is above said low current level, and wherein said comparator output node is pulled low via said second NMOS transistor when said bias current falls to said low current level.

6. The POR circuit of claim 5, further comprising an inverter supplied by the secondary supply voltage having an input coupled to said comparator output node and having an output providing a compare POR signal to said control gate, wherein said control gate determines said reset state of the secondary power domain based on said level shifted primary POR signal, said delayed secondary POR signal, and said compare POR signal.

7. The POR circuit of claim 5, wherein said level shift and isolation circuit comprises:
a third PMOS transistor having a source terminal coupled to the secondary supply voltage, having a gate terminal coupled to said first node, and having a drain terminal coupled to a second node;
a fourth PMOS transistor having a source terminal coupled to the secondary supply voltage, having a gate terminal receiving said level shifted primary POR signal, and having a drain terminal;
a fifth PMOS transistor having a source terminal coupled to said drain terminal of said fourth PMOS transistor, having a drain terminal coupled to said second node, and having a gate terminal coupled to a third node;
a third NMOS transistor having a drain terminal coupled to said second node, having a source terminal coupled to ground, and having a gate terminal coupled to said third node; and
a buffer supplied by the primary supply voltage, having an input receiving said primary POR signal and having an output coupled to said third node.

8. The POR circuit of claim 5, further comprising:
an inverter supplied by the secondary supply voltage having an input coupled to said comparator output node and having an output providing a compare POR signal; and
wherein said level shift and isolation circuit comprises:
a buffer supplied by the primary supply voltage having an input receiving said primary POR signal from the primary supply domain and an output providing a buffered primary POR signal;
a third NMOS transistor having a drain terminal, having a gate terminal receiving said buffered primary POR signal, and having a source terminal coupled to ground; and
a fourth NMOS transistor having a drain terminal, having a gate terminal receiving said compare POR signal, and having a source terminal coupled to said drain terminal of said third NMOS transistor; and
a latch and pullup circuit having an inverted reset input receiving said compare POR signal, having a control input coupled to said drain terminal of said second NMOS transistor, and having an output providing said level shifted primary POR signal; and
wherein said latch and pullup circuit holds said level shifted primary POR signal low while said compare POR signal is low, and wherein when said compare POR signal goes high, said latch and pullup circuit asserts said level shifted primary POR signal to reflect a state of said primary POR signal received via said control input.

9. The POR circuit of claim 5, further comprising:
a first inverter supplied by the primary supply voltage having an input receiving said primary POR signal and having an output providing an inverted primary POR signal;
a second inverter supplied by the primary supply voltage having an input receiving said inverted primary POR signal and having an output providing a buffered primary POR signal;
a third NMOS transistor having a drain terminal, having a gate terminal receiving said buffered primary POR signal and having a source terminal coupled to ground;
a fourth NMOS transistor having a drain terminal, having a gate terminal receiving said inverted primary POR signal and having a source terminal coupled to ground;
a third inverter supplied by the secondary supply voltage having an input coupled to said comparator output node and having an output providing a compare POR signal;
a fifth NMOS transistor having a drain terminal, having a gate terminal receiving said compare POR signal and having a source terminal coupled to said drain terminal of said third NMOS transistor;
a sixth NMOS transistor having a drain terminal, having a gate terminal receiving said compare POR signal and having a source terminal coupled to said drain terminal of said fourth NMOS transistor; and
a latch circuit having an inverted reset input receiving said compare POR signal, having a first latch node coupled to said drain terminal of said fifth NMOS transistor, having a second latch node coupled to said drain terminal of said sixth NMOS transistor, and having a buffer supplied by the secondary supply voltage having an input coupled to said second latch node and having an output providing said level shifted primary POR signal.

10. The POR circuit of claim 1, wherein said level shift and isolation circuit comprises:
a buffer supplied by the primary supply voltage having an input receiving said primary POR signal from the primary supply domain and an output providing a buffered primary POR signal; and
a latch circuit that isolates said buffered primary POR signal while said bias current is above said low current level, and that otherwise converts said buffered primary signal to said level shifted POR signal.

11. The POR circuit of claim 1, wherein said delay circuit comprises:
a first NMOS transistor having a drain terminal coupled to the secondary supply voltage, having a source terminal coupled to said second reference voltage, and having a gate terminal coupled to ground, wherein said first NMOS transistor comprises a low threshold voltage NMOS transistor;
a first capacitor coupled between the secondary supply voltage and said second reference voltage;
a first voltage offset circuit coupled between said second reference voltage and ground;
a first PMOS transistor having a source terminal coupled to the secondary supply voltage, having a gate terminal coupled to said second reference voltage, and having a drain terminal coupled to an early node;
a second capacitor coupled between said early node and ground;
a second PMOS transistor having a source terminal coupled to the secondary supply voltage, having a drain terminal coupled to said early node, and having a gate terminal coupled to a first node;
a third PMOS transistor having a source terminal coupled to the secondary supply voltage, having a drain terminal coupled to said first node, and having a gate terminal coupled to said early node;
a second NMOS transistor having a drain terminal coupled to said first node, having a gate terminal coupled to said early node, and having a source terminal coupled to ground; and
an inverter supplied by the secondary supply voltage having an input coupled to said first node and having an output providing said delayed secondary POR signal.

12. The POR circuit of claim 11, wherein said first voltage offset circuit comprises at least one diode-coupled NMOS transistor.

13. The POR circuit of claim 11, further comprising:
a second voltage offset circuit interposed between said source terminal of said second NMOS transistor and ground; and
a third NMOS transistor having a drain terminal coupled to said source terminal of said second NMOS transistor, having a gate terminal receiving said delayed secondary POR signal, and having a source terminal coupled to ground.

14. An integrated circuit, comprising:
a primary supply domain receiving a primary supply voltage and comprising a primary power-on reset (POR) circuit providing a primary POR signal;
a secondary supply domain receiving a secondary supply voltage and comprising a secondary POR circuit providing a secondary POR signal, wherein said secondary POR circuit comprises:
a bias and reference circuit that develops a startup current in response to ramping up of said secondary supply voltage, and that mirrors a bias current into a plurality of transistors coupled into a voltage loop which establishes a reference voltage;
a comparator receiving said bias current, having a first input receiving said reference voltage and having a second input receiving the primary supply voltage, wherein said comparator controls a level of said bias current to a high current level when said reference voltage is greater than said primary supply voltage by more than a predetermined voltage offset and to a low current level when said primary supply voltage is at least said reference voltage less said predetermined voltage offset;
a level shift and isolation circuit that isolates said primary POR signal and holds said secondary supply domain in a reset state while said bias current is above said low current level, and that converts said primary POR signal to a level shifted primary POR signal when said bias current falls to said low current level;
a delay circuit that provides a delayed secondary POR signal a predetermined time period after said secondary supply voltage achieves a predetermined voltage threshold; and
a control gate that determines said reset state of said secondary power domain based on said level shifted primary POR signal and said delayed secondary POR signal.

15. The IC of claim 14, further comprising:
a first low threshold voltage device that provides said startup current when said secondary supply voltage rises above ground;
wherein said voltage loop comprises a plurality of second low threshold voltage devices that are activated by said startup current and that increase voltage on a first node coupled to said first low threshold voltage device based on said bias current; and
wherein said first low threshold voltage device is turned off when said voltage on a first node reaches a predetermined threshold level.

16. The IC of claim 14, wherein:
said bias and reference circuit comprises a first current device coupled to said secondary supply voltage and said comparator that provides said bias current;
wherein said comparator comprises a low threshold voltage device as part of said voltage loop that is activated by said startup current and that controls said bias current; and
wherein said bias and reference circuit comprises a plurality of second current devices coupled in a mirrored configuration with said first current device to mirror said bias current through said voltage loop.

17. The IC of claim 14, wherein said level shift and isolation circuit comprises:
a current device coupled in a mirrored configuration with said bias and reference circuit that forces a first node referenced within said secondary supply domain within said isolation circuit to prevent said secondary supply domain from leaving said reset state while said bias current is above said low current level, and that releases said first node to allow said secondary supply domain to leave said reset state when said bias current falls to said low current level;

a buffer supplied by said primary supply voltage having an input receiving said primary POR signal and having an output providing a buffered primary POR signal to a second node; and a level shift circuit coupled to said first and second nodes and supplied by said secondary supply voltage that converts said buffered primary POR signal to said level shifted POR signal when said first node is released.

18. The IC of claim 14, wherein said delay circuit comprises:

a reference circuit that develops a second reference voltage in response to an increase of said secondary supply voltage;

a capacitor coupled to an early node;

a current device that turns on to charge said capacitor to increase voltage of said early node after said secondary supply voltage rises above said second reference voltage by a first threshold voltage; and a switch circuit that switches said delayed secondary POR signal when said early node reaches a second threshold voltage.

19. A method of releasing a secondary supply domain of an integrated circuit from a reset state, wherein the secondary supply domain is powered by a secondary supply voltage and receives a primary power-on reset (POR) signal from a primary supply domain powered by a primary supply voltage, said method comprising:

providing startup current to a comparator as the secondary supply voltage begins to rise;

comparing, by the comparator, a reference voltage with the primary supply voltage and developing a bias current, and switching the comparator so that the bias current is at a low current level when the primary supply voltage is at least a predetermined voltage offset of less than the reference voltage and so that the bias current is at a high current level when the reference voltage is greater than the primary supply voltage by more than the predetermined voltage offset;

mirroring the bias current through a plurality of transistors forming a voltage loop to establish the reference voltage;

isolating the primary POR signal from the secondary supply domain and holding the secondary supply domain in the reset state while the bias current is above the low current level;

when the bias current falls to the low current level, detecting the primary POR signal;

providing a delayed secondary POR signal a predetermined time period after the secondary supply voltage achieves a predetermined voltage threshold; and releasing the secondary power domain from the reset state when the comparator, the primary POR signal and the delayed secondary POR signal indicate release from the reset state.

20. The method of claim 19, further comprising level shifting the primary POR signal to provide a level shifted POR signal in the secondary supply domain, and releasing the secondary power domain from the reset state when the comparator, the level shifted primary POR signal and the delayed secondary POR signal indicate release from the reset state.

* * * * *